United States Patent
Farrow et al.

(10) Patent No.: US 8,517,085 B2
(45) Date of Patent: Aug. 27, 2013

(54) VAPOR FLOW IN HEAT PIPE USING CENTRIFUGAL BLOWER

(75) Inventors: Timothy Samuel Farrow, Cary, NC (US); Albert Vincent Makley, Morrisville, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 1029 days.

(21) Appl. No.: 12/203,657

(22) Filed: Sep. 3, 2008

(65) Prior Publication Data
US 2010/0051238 A1 Mar. 4, 2010

(51) Int. Cl.
*F28D 15/00* (2006.01)

(52) U.S. Cl.
USPC ................. 165/104.25; 165/104.22

(58) Field of Classification Search
USPC ....................... 165/104.25, 104.22
See application file for complete search history.

(56) References Cited

U.S. PATENT DOCUMENTS

| 3,609,991 | A | * | 10/1971 | Chu et al. ..................... 62/333 |
| 4,274,479 | A | * | 6/1981 | Eastman ................. 165/104.26 |
| 5,174,271 | A | * | 12/1992 | Seo ............................ 126/110 R |
| 6,119,462 | A | * | 9/2000 | Busick et al. ................ 62/3.64 |
| 6,408,937 | B1 | * | 6/2002 | Roy ........................ 165/104.33 |
| 6,571,863 | B1 | * | 6/2003 | Liu ........................ 165/104.21 |
| 6,725,909 | B1 | * | 4/2004 | Luo ........................ 165/104.21 |
| 7,055,581 | B1 | * | 6/2006 | Roy ........................ 165/104.33 |
| 7,438,120 | B2 | * | 10/2008 | Hong et al. ................ 165/80.4 |
| 7,980,078 | B2 | * | 7/2011 | McCutchen et al. ........... 60/645 |
| 2005/0011633 | A1 | * | 1/2005 | Garner et al. ........... 165/104.26 |
| 2009/0242174 | A1 | * | 10/2009 | McCutchen et al. ..... 165/104.25 |

* cited by examiner

*Primary Examiner* — Brandon M Rosati
(74) *Attorney, Agent, or Firm* — John L. Rogitz; John M. Rogitz

(57) ABSTRACT

An assisted heat pipe comprises an evaporator section, a condenser section, and a blower. The evaporator section converts a fluid from a liquid form to a vapor form, and the condenser section converts the fluid from a vapor form to back to a liquid form. The blower is encapsulated within the assisted heat pipe and resides between the evaporator section and the condenser section. The blower rotates and assists the vapor to travel from the evaporator section to the condenser section.

6 Claims, 7 Drawing Sheets

_US 8,517,085 B2_

VAPOR FLOW IN HEAT PIPE USING CENTRIFUGAL BLOWER

BACKGROUND OF THE INVENTION

1. Technical Field

The present invention relates to utilizing a centrifugal blower to improve vapor flow in a heat pipe. More particularly, the present invention relates to an assisted heat pipe that includes an encapsulated blower located between the assisted heat pipe's evaporator section and condenser section in order to assist the vapor flow traveling from the evaporator section to the condenser section.

2. Description of the Related Art

Computer systems include electronic devices that dissipate a tremendous amount of heat. In order to dissipate the heat generated from the electronic devices, computer systems may include heat sinks and heat pipes. The invention described herein pertains to enhancing the heat dissipation of a heat pipe.

SUMMARY

An assisted heat pipe comprises an evaporator section, a condenser section, and a blower. The evaporator section converts a fluid from a liquid form to a vapor form, and the condenser section converts the fluid from a vapor form to back to a liquid form. The blower inserts between the evaporator section and the condenser section and propels the vapor from the evaporator section to the condenser section.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings, wherein.

DETAILED DESCRIPTION

Certain specific details are set forth in the following description and figures to provide a thorough understanding of various embodiments of the invention. Certain well-known details often associated with computing and software technology are not set forth in the following disclosure, however, to avoid unnecessarily obscuring the various embodiments of the invention. Further, those of ordinary skill in the relevant art will understand that they can practice other embodiments of the invention without one or more of the details described below. Finally, while various methods are described with reference to steps and sequences in the following disclosure, the description as such is for providing a clear implementation of embodiments of the invention, and the steps and sequences of steps should not be taken as required to practice this invention. Instead, the following is intended to provide a detailed description of an example of the invention and should not be taken to be limiting of the invention itself. Rather, any number of variations may fall within the scope of the invention, which is defined by the claims that follow the description.

The following detailed description will generally follow the summary of the invention, as set forth above, further explaining and expanding the definitions of the various aspects and embodiments of the invention as necessary.

Figure 1:
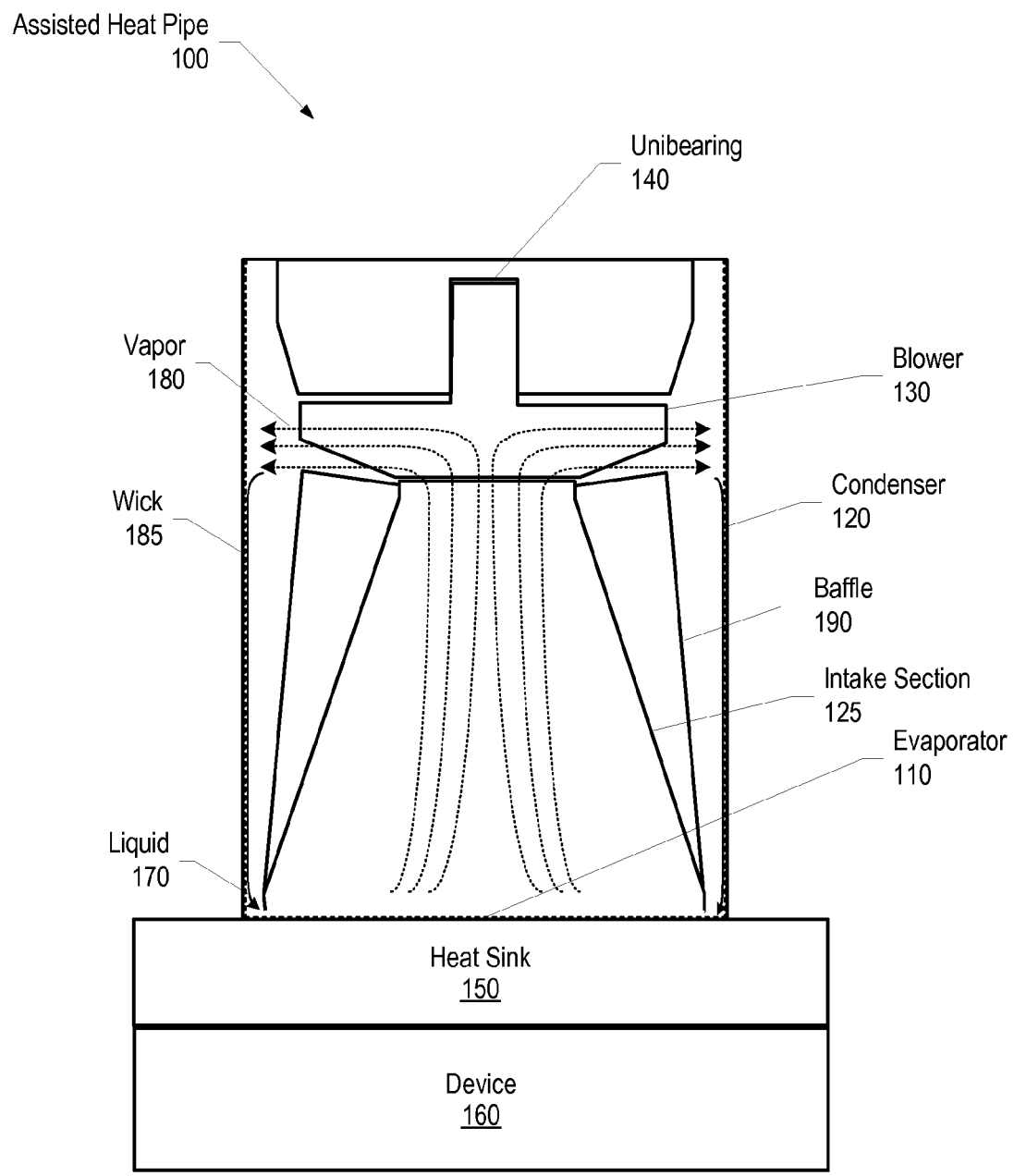
FIG. 1 is a diagram showing an assisted heat pipe utilizing an encapsulated blower in order to assist vapor to travel from an evaporator section to a condenser section.

FIG. 1 is a diagram showing an assisted heat pipe utilizing an encapsulated blower in order to assist vapor to travel from an evaporator section to a condenser section. Assisted heat pipe 100 is a sealed heat pipe that comprises evaporator section 110, condenser section 120, and blower 130. Assisted heat pipe 100 couples to heat sink 150, which couples to electronic device 160.

During device 160's operation, device 160 generates heat, which causes heat sink 150 to increase in temperature. In turn, heat sink 150 heats evaporator section 110. When this occurs, a fluid included in assisted heat pipe 100 transforms to vapor 180, which rises through intake section 125 up to a blower intake area located at the center of blower 130 (see FIGS. 3A, 3B, and corresponding text for further details). Blower 130 rotates at a high rate of speed (e.g., 2,500-5,000 rpms), which forces vapor 180 into condenser section 120 (see FIGS. 4, 5, and corresponding text for further details). In a preferred embodiment, intake section 125 is cone-shaped as shown in FIG. 1 (e.g., a truncated cone). In other embodiments, intake section 125 may be step-wise, linear, or curvilinear.

Condenser section 120 includes wick 185 that assists vapor 180 to condensate into liquid 170 and travel back to evaporator section, regardless of assisted heat pipe 100's orientation. As long as device 160 continues to indirectly heat evaporator section 170, the above cycle repeats, thus dissipating device 160's heat.

Assisted heat pipe 100 also includes baffle 190, which channels vapor 180 through condenser section 120 and prohibits vapor 180 to re-circulate. Blower 130 couples to uni-bearing 140, which causes blower 130 to rotate upon a central axis.

In one embodiment, assisted heat pipe 100 may be pressurized at a different pressure than ambient pressure based upon its working fluid and the temperature at which the liquid vaporizes and condenses.

Figure 2:
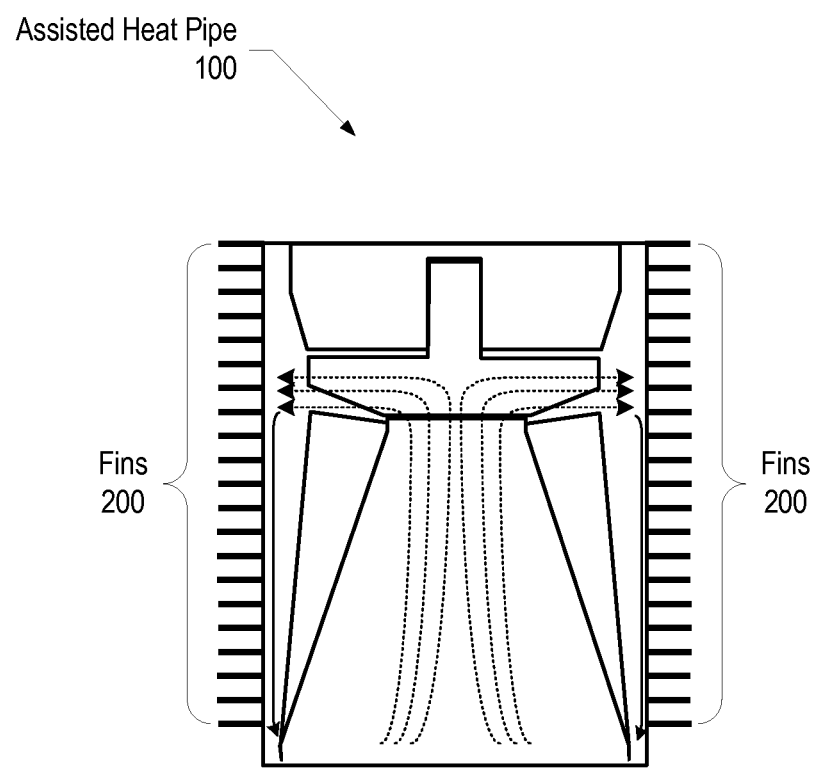
FIG. 2 is a diagram showing an assisted heat pipe that includes external fins to assist in dissipating heat.

FIG. 2 is a diagram showing an assisted heat pipe that includes external fins to assist in dissipating heat. Assisted heat pipe 100 is a sealed heat pipe that includes an encapsulated blower. The example shown in FIG. 2 shows fins 200 affixed to the side walls (condenser section walls) of assisted heat pipe 100. As such, fins 200 increase the surface area of the side walls, thus increasing the rate of heat dissipation to an external environment.

Figure 3A:
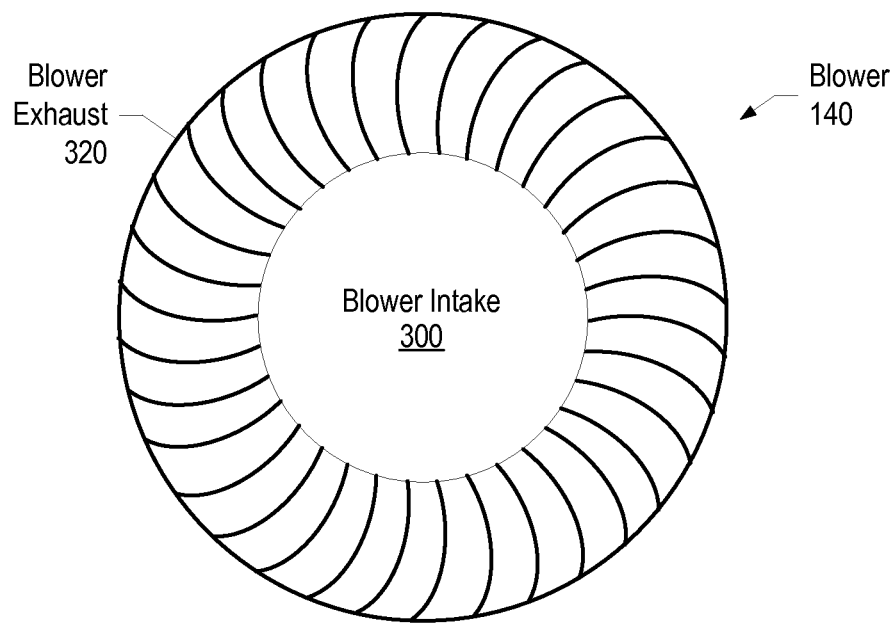
FIG. 3A is a diagram showing a blower underside that includes an intake and an exhaust.

FIG. 3A is a diagram showing a blower underside that includes an intake and an exhaust. Blower 140 couples to magnets that interact with motor windings that produce an electromagnetic field. As such, blower 140 rotates in a direction corresponding to the electromagnetic field (see FIGS. 5, 6, and corresponding text for further details). Utilizing the example shown in FIG. 3A, blower 140 would rotate in a counterclockwise direction such that vapor entering blower intake 300 exits through blower exhaust 320 (perimeter of blower 140).

Figure 3B:
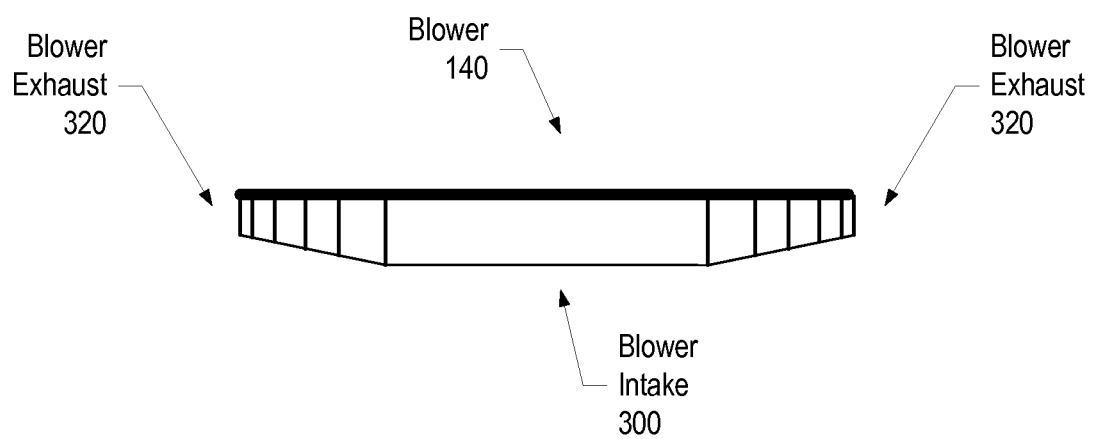
FIG. 3B is a diagram showing a blower cross-section view.

FIG. 3B is a diagram showing a blower cross-section view. Blower 140 includes blower intake 300 and blower exhaust 320. Vapor from an assisted heat pipe's evaporator section enters blower intake 300. Blower 140 rotates and forces the vapor out of blower exhaust 320 in a direction perpendicular to the incoming vapor. The vapor exiting blower exhaust 320 enters the assisted heat pipe's condenser section and transforms to liquid.

In one embodiment, blower 140 centripetally accelerates the vapor and at the outer perimeter blower 140 turns the vapor in a direction that is parallel to the direction of the incoming vapor.

Figure 4:
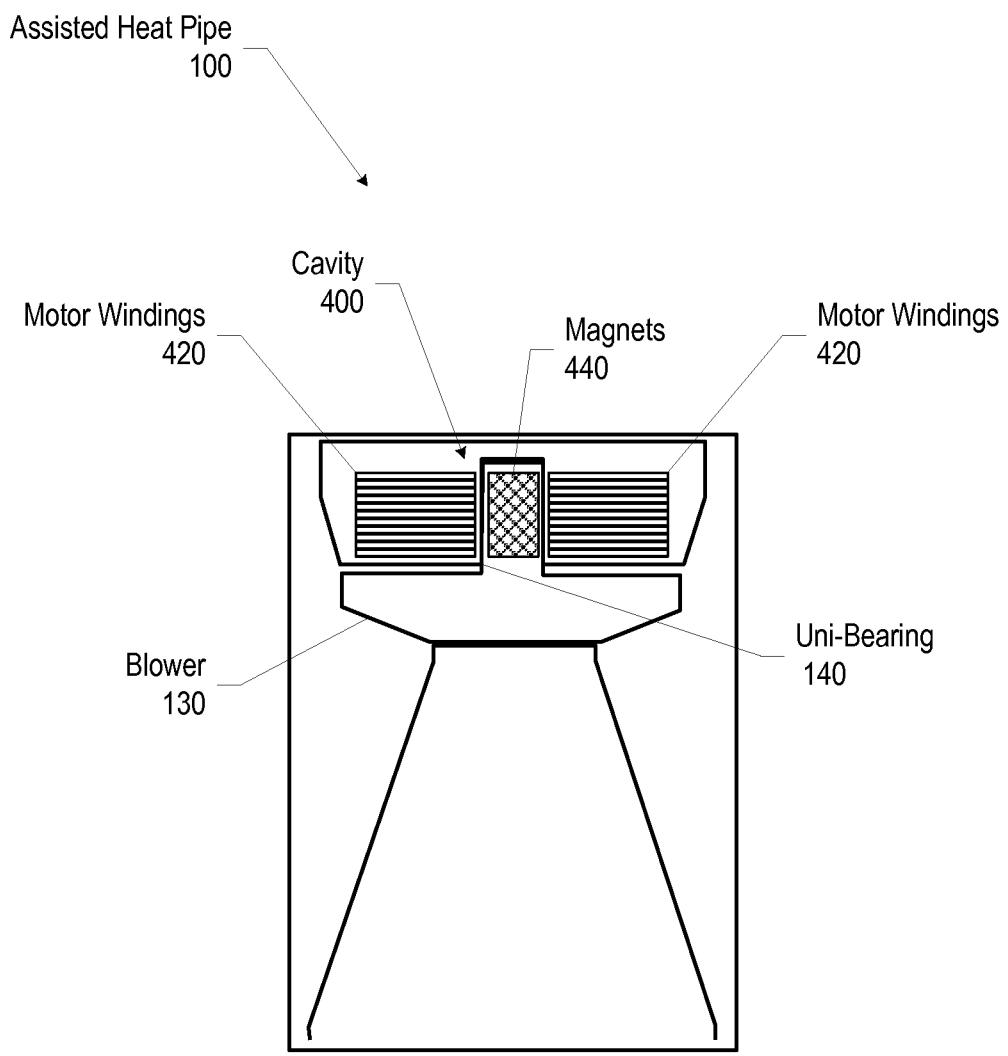
FIG. 4 is a diagram showing an assisted heat pipe with magnets affixed to a uni-bearing that is coupled to a blower.

FIG. 4 is a diagram showing an assisted heat pipe with magnets affixed to a uni-bearing that is coupled to a blower. Assisted heat pipe 100 includes cavity 400, which is external to assisted heat pipe 100's sealed internal area. Motor windings 420 reside within cavity 400 and are connected to an electrical current source. When the electrical current source provides an electrical current, motor windings 420 generate an electromagnetic field. Magnets 440 are affixed to uni-bearing 140, which is coupled to blower 130. The electromagnetic field propels magnets 440, thus rotating blower 130. As one skilled in the art can appreciate, other motor winding/magnet configurations may be utilized to rotate blower 130 (see FIG. 5 and corresponding text for further details).

Figure 5:
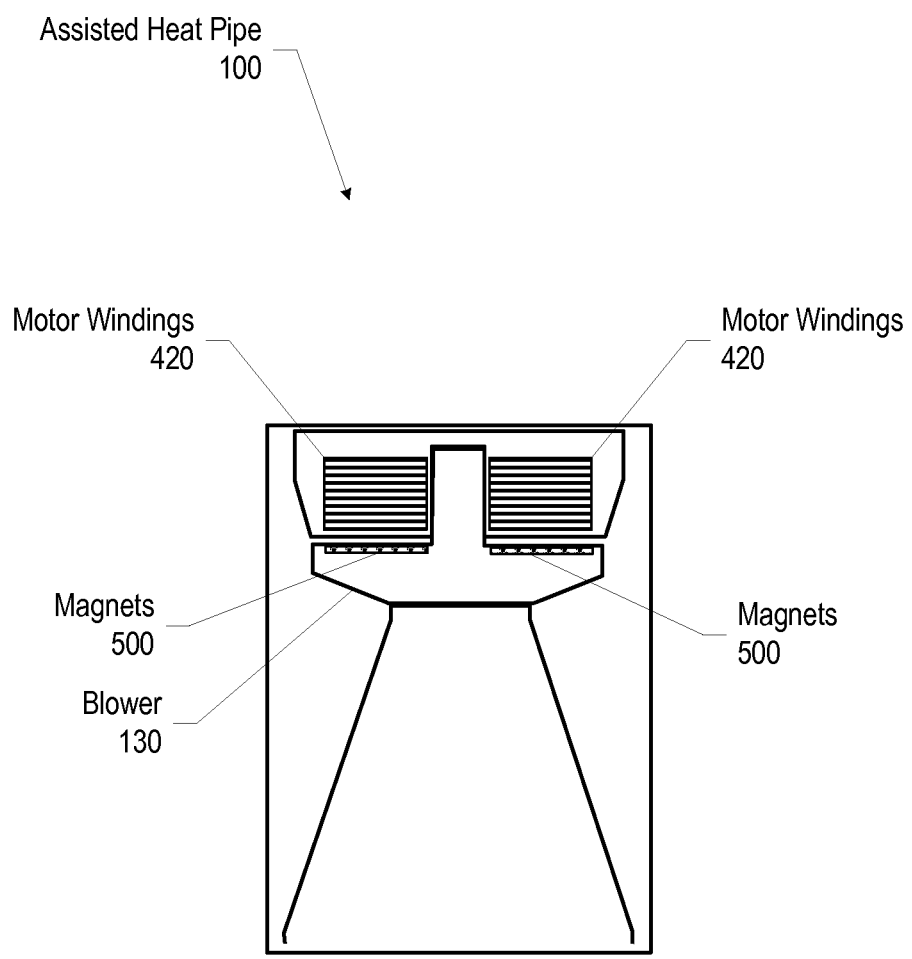
FIG. 5 is a diagram showing an assisted heat pipe with magnets affixed to a blower that interacts with an electromagnetic field to rotate the blower.

FIG. 5 is a diagram showing an assisted heat pipe with magnets affixed to a blower that interacts with an electromagnetic field to rotate the blower. FIG. 5 is similar to FIG. 4 with the exception that assisted heat pipe 100's magnets 500 are affixed to blower 130 directly. As such, the electromagnetic field generated by motor windings 420 propels magnets 500, thus rotating blower 130. In one embodiment, motor windings 420 are located inside the assisted heat pipe 100.

Figure 6:
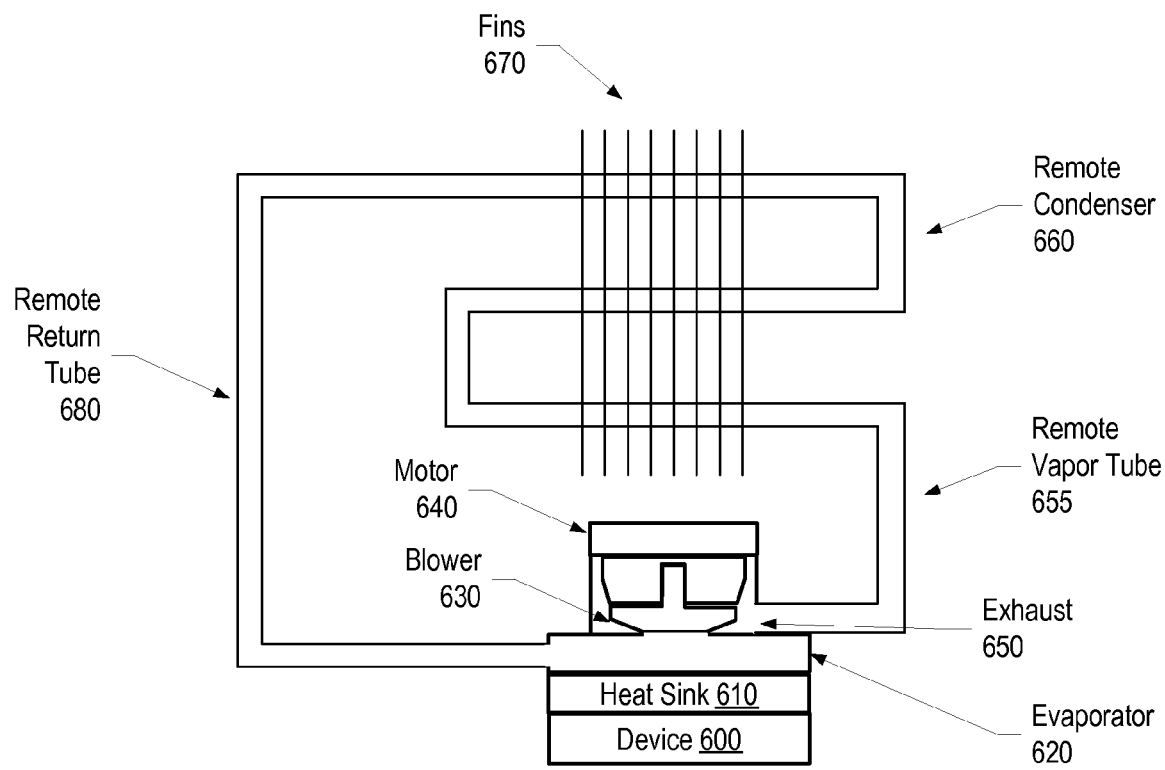
FIG. 6 is a diagram showing an assisted heat pipe that includes a remote condenser section.

FIG. 6 is a diagram showing an assisted heat pipe that includes a remote condenser section. Some computer system configurations may require a remote condenser section to adequately dissipate heat. In these situations, remote condenser section 660 is located remotely from device 600. As device 600 functions and heats heat sink 610, liquid inside evaporator 620 transforms to vapor and travels into blower 630's intake.

Motor 640 rotates blower 630, which propels the vapor out of blower exhaust 650 and into remote vapor tube 655. The vapor travels though remote vapor tube 655 into remote condenser section 660 and transforms to liquid. The example shown in FIG. 6 includes fins 670, which assists in heat dissipation. The liquid travels down remote return tube 680 and back into evaporator 620. The liquid then transforms to vapor and the process repeats.

Figure 7:
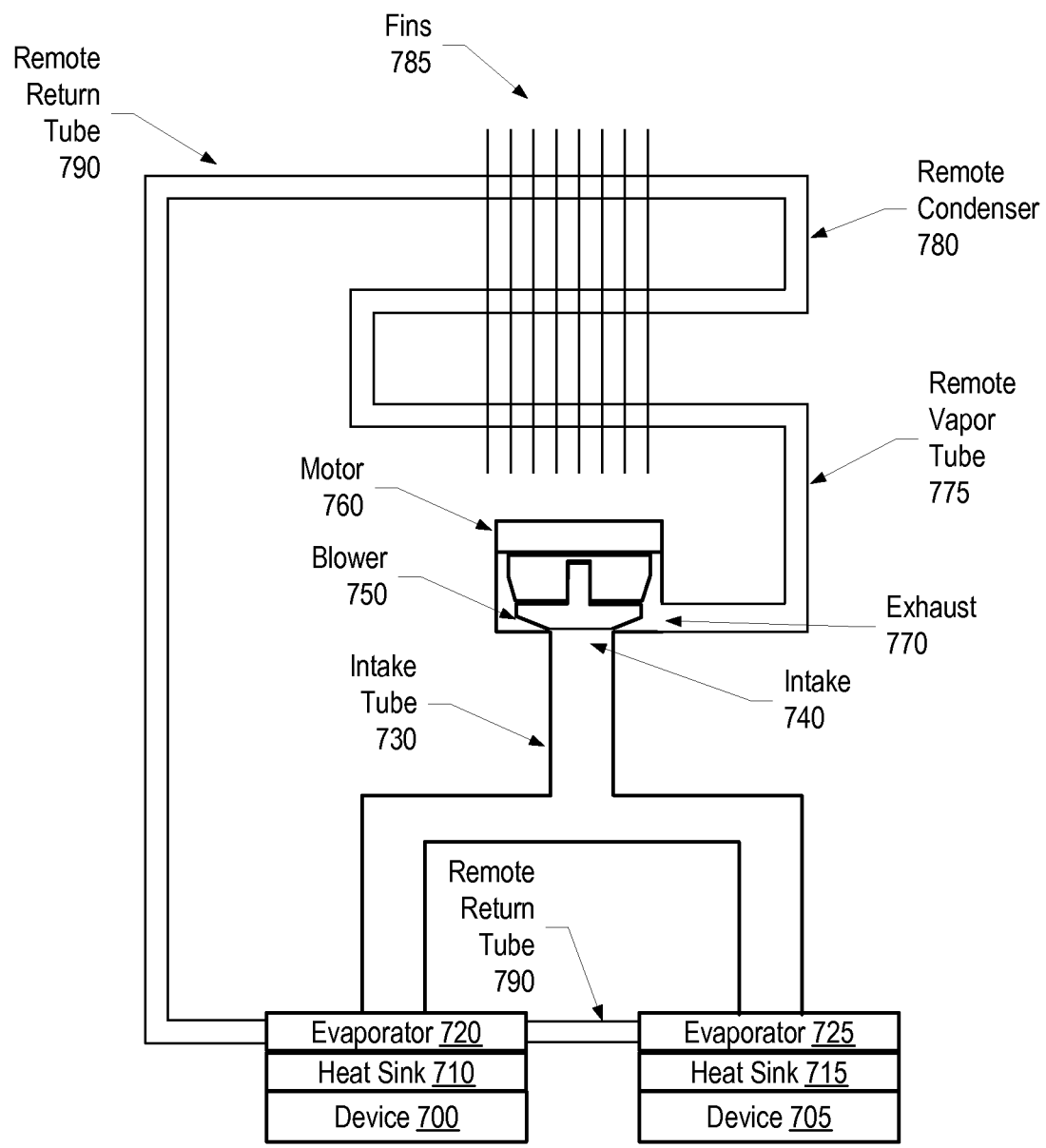
FIG. 7 is a diagram showing an assisted heat pipe coupled to a plurality of devices.

FIG. 7 is a diagram showing an assisted heat pipe coupled to a plurality of devices. FIG. 7 is similar to FIG. 6 with the exception that the assisted heat pipe receives vapor from a plurality of evaporators that dissipate heat from a plurality of electronic devices. As devices 700-705 function and increase the temperature of heat sinks 710-715, liquid inside evaporators 720-725 transforms to vapor and travels through intake tube 730 into blower 750's intake 740.

Motor 760 rotates blower 750, which propels the vapor out of blower exhaust 770 and into remote vapor tube 775. The vapor travels though remote vapor tube 775 into remote condenser section 780 and transforms to liquid. The example shown in FIG. 7 includes fins 785, which assists in heat dissipation. The liquid travels down remote return tube 790 and back into evaporators 720-725. The liquid then transforms to vapor and the process repeats.

While particular embodiments of the present invention have been shown and described, it will be obvious to those skilled in the art that, based upon the teachings herein, that changes and modifications may be made without departing from this invention and its broader aspects. Therefore, the appended claims are to encompass within their scope all such changes and modifications as are within the true spirit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use in the claims of definite articles.

What is claimed is:

1. An apparatus comprising:
    an assisted heat pipe that comprises an evaporator section and a condenser section, the evaporator section converting a fluid from a liquid to a vapor and the condenser section converting the vapor to the liquid;
    a blower inserted between the evaporator section and the condenser section, wherein the blower is encapsulated within the assisted heat pipe and assists the vapor in traveling from the evaporator section to the condenser section by receiving the vapor from the evaporator section, redirecting the received vapor in a perpendicular direction, and transmitting the re-directed vapor to the condenser section; and an intake section between the evaporator section and the blower that directs the vapor from the evaporator section to a blower intake that is located at a center portion of the blower, the intake section being a truncated cone in shape and tapering from wider to narrower from the evaporator section to the blower.

2. The apparatus of claim 1 further comprising:
    an electronic device that dissipates heat;
    a heat sink coupled to the electronic device and coupled to the assisted heat pipe at the evaporator section, wherein the heat dissipation from the device heats the heat sink, which causes the evaporator section to heat and transform the liquid to the vapor.

3. The apparatus of claim 1 wherein the assisted heat pipe is sealed and pressurized internally at a different pressure than an external ambient pressure.

4. The apparatus of claim 1 further comprising:
    a wick included in the condenser section that collects the vapor and transfers the converted liquid to the evaporator section.

5. The apparatus of claim 1 further comprising:
    a baffle that prohibits the vapor from re-circulating within the condenser section.

6. An apparatus comprising:
- an assisted heat pipe that comprises an evaporator section and a condenser section, the evaporator section converting a fluid from a liquid to a vapor and the condenser section converting the vapor to the liquid;
- a blower inserted between the evaporator section and the condenser section, wherein the blower is encapsulated within the assisted heat pipe and assists the vapor in traveling from the evaporator section to the condenser section by receiving the vapor from the evaporator section and transmitting the vapor to the condenser section, the condenser section not being exposed to atmospheric air; an intake section between the evaporator section and the blower that directs the vapor from the evaporator section to a blower intake that is located at a center portion of the blower, the intake section being a truncated cone in shape and tapering from wider to narrower from the evaporator section to the blower.

* * * * *